United States Patent
Fukamachi

(10) Patent No.: US 10,916,522 B2
(45) Date of Patent: Feb. 9, 2021

(54) SEMICONDUCTOR DEVICE AND METHOD FOR MANUFACTURING SAME

(71) Applicant: NICHIA CORPORATION, Anan (JP)

(72) Inventor: Daisuke Fukamachi, Tokushima (JP)

(73) Assignee: NICHIA CORPORATION, Anan (JP)

( * ) Notice: Subject to any disclaimer, the term of this patent is extended or adjusted under 35 U.S.C. 154(b) by 20 days.

(21) Appl. No.: 16/143,300

(22) Filed: Sep. 26, 2018

(65) Prior Publication Data

US 2019/0096847 A1    Mar. 28, 2019

(30) Foreign Application Priority Data

Sep. 27, 2017   (JP) ................................ 2017-186081

(51) Int. Cl.
*H01L 23/00* (2006.01)
*H01L 23/495* (2006.01)
*H01L 33/62* (2010.01)

(52) U.S. Cl.
CPC .......... *H01L 24/85* (2013.01); *H01L 23/4951* (2013.01); *H01L 23/4952* (2013.01); *H01L 24/48* (2013.01); *H01L 24/45* (2013.01); *H01L 33/62* (2013.01); *H01L 2224/45144* (2013.01); *H01L 2224/48091* (2013.01); *H01L 2224/48465* (2013.01); *H01L 2224/85035* (2013.01); *H01L 2224/85205* (2013.01); *H01L 2224/85986* (2013.01); *H01L 2933/0066* (2013.01)

(58) Field of Classification Search
None
See application file for complete search history.

(56) References Cited

U.S. PATENT DOCUMENTS

| 5,967,401 A | 10/1999 | Nishiura et al. |
| 2004/0041008 A1 | 3/2004 | Mochida |
| 2010/0207280 A1* | 8/2010 | Mii .......... H01L 24/85 257/784 |

(Continued)

FOREIGN PATENT DOCUMENTS

| JP | H07-176558 A | 7/1995 |
| JP | H10-189646 | 7/1998 |
| JP | H11-067808 A | 3/1999 |

(Continued)

*Primary Examiner* — Anthony Ho
*Assistant Examiner* — Kevin Quinto
(74) *Attorney, Agent, or Firm* — Foley & Lardner LLP

(57) ABSTRACT

A method for manufacturing a semiconductor device includes: a first bonding process including bonding, at a first bonding point, a tip of a wire held by a capillary; a first lifting process including moving the capillary upward; a first reverse process including moving the capillary in a direction that includes a component in a first direction that is from a second bonding point toward the first bonding point; a second lifting process including moving the capillary upward; a second reverse process including moving the capillary in the first direction; a third lifting process including moving the capillary upward; a forward process including moving the capillary toward the second bonding point; and a second bonding process including bonding the wire at the second bonding point. A movement distance of the capillary in the first lifting process is not less than a movement distance of the capillary in the second lifting process.

11 Claims, 10 Drawing Sheets

(56) References Cited

U.S. PATENT DOCUMENTS

2016/0126435 A1   5/2016   Akaishi et al.

FOREIGN PATENT DOCUMENTS

| JP | 2003-273150 | A | * | 9/2003 | ............ H01L 24/85 |
|----|-------------|---|---|--------|-------------------------|
| JP | 2003-273150 | A |   | 9/2003 |                         |
| JP | 2004-087747 | A |   | 3/2004 |                         |
| JP | 2004-319921 | A |   | 11/2004 |                        |
| JP | 2009-124093 | A |   | 6/2009 |                         |
| JP | 2011-018843 | A |   | 1/2011 |                         |
| JP | 2016-092419 | A |   | 5/2016 |                         |

\* cited by examiner

SEMICONDUCTOR DEVICE AND METHOD FOR MANUFACTURING SAME

CROSS-REFERENCE TO RELATED APPLICATIONS

This application is based upon and claims the benefit of priority from Japanese Patent Application No. 2017-186081, filed on Sep. 27, 2017, the entire contents of which are incorporated herein by reference.

FIELD

Embodiments of the present disclosure relate to a semiconductor device and a method for manufacturing the same.

BACKGROUND

As one type of a semiconductor device using a semiconductor, such as a light emitting diode (LED), etc., there is a semiconductor device in which the electrode of a semiconductor chip disposed on a lead is connected by a wire to a lead. The cost is reduced by using a fine wire. Also, in the case of a light-emitting device using a light-emitting element as a semiconductor element, the light is blocked by the wires disposed on the light-emitting surface of the light-emitting element. Therefore, fine wires are used from the perspective of light extraction efficiency.

SUMMARY

A method for manufacturing a semiconductor device according to an embodiment includes a first bonding process, a first lifting process, a first reverse process, a second lifting process, a second reverse process, a third lifting process, a forward process, and a second bonding process. In the first bonding process, a tip of a wire held by a capillary is bonded at a first bonding point. In the first lifting process, the capillary is moved upward. In the first reverse process, the capillary is moved in a direction including a first direction; and the first direction is from a second bonding point toward the first bonding point. In the second lifting process, the capillary is moved upward. In the second reverse process, the capillary is moved in the first direction. In the third lifting process, the capillary is moved upward. In the forward process, the capillary is moved toward the second bonding point. In the second bonding process, the wire is bonded at the second bonding point. A movement distance of the capillary in the first lifting process is not less than a movement distance of the capillary in the second lifting process.

A semiconductor device according to an embodiment includes a wire connected between a first bonding point and a second bonding point. The wire includes a first portion, a second portion, and a third portion; the first portion extends upward from the first bonding point; the second portion extends from an upper end of the first portion in a direction including a direction from the first bonding point toward the second bonding point; and the third portion extends from the second portion toward the second bonding point. Two marks that extend in a direction crossing an extension direction of the first portion are formed in a side surface of the first portion on the second bonding point side.

DETAILED DESCRIPTION

Figure 1:
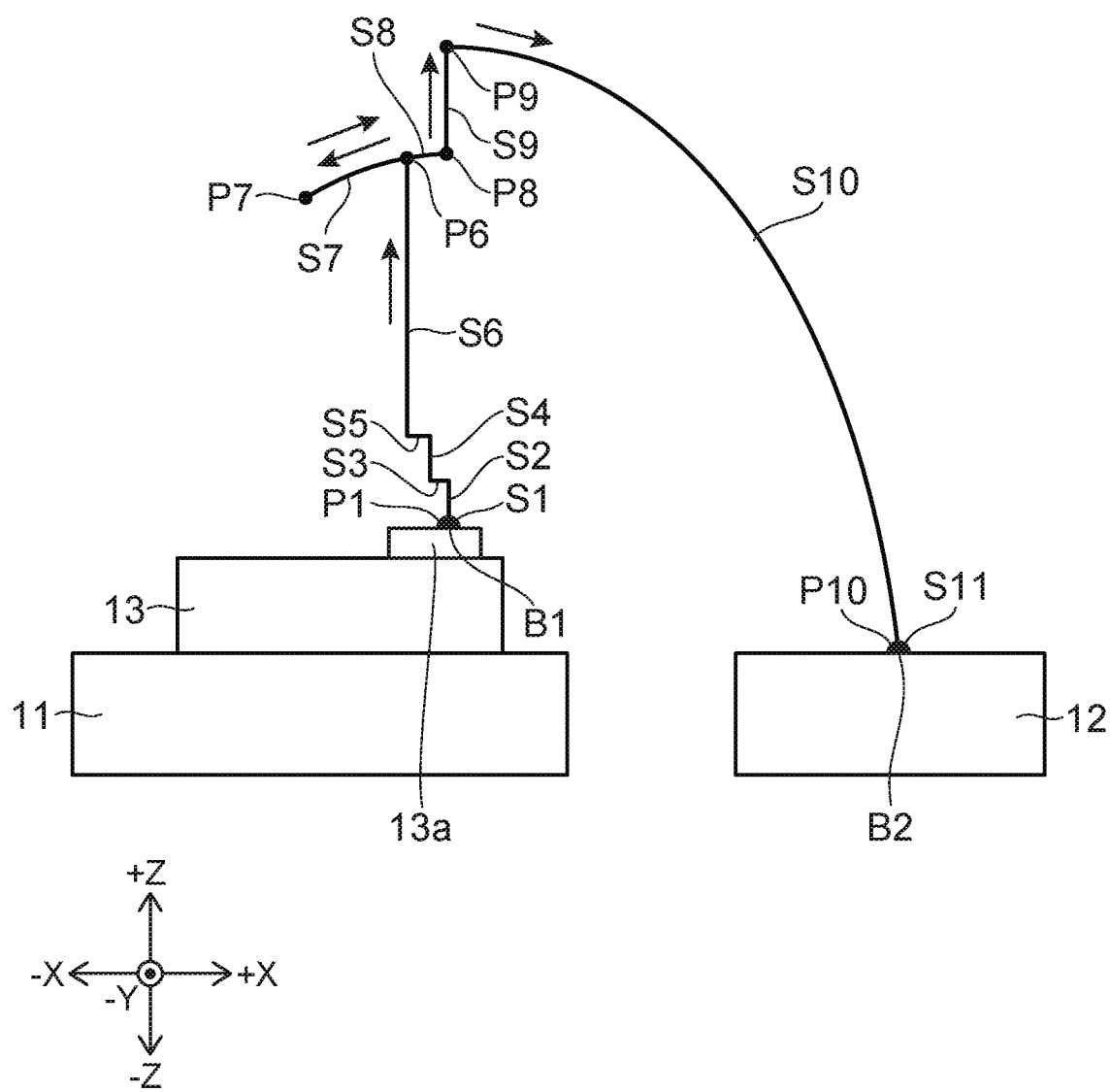
FIG. 1 is a drawing showing a path of a capillary of a wire connection method according to a first embodiment.

Embodiments of the invention will be described below with reference to the drawings as appropriate. However, while the methods for manufacturing the semiconductor device described below embodies the technical idea of the invention, the invention is not limited to the following description unless specifically stated. Also, the sizes, positional relationships, and the like of the members shown in the drawings may be exaggerated to clarify the description. An XYZ orthogonal coordinate system is employed in the specification for convenience of description. The direction from a first bonding point toward a second bonding point is taken as a "+X direction;" and the reverse direction is taken as a "−X direction." The +X direction and the −X direction also are generally called the "X-direction," The −X direction corresponds to a first direction; and the +X direction corresponds to a second direction. A direction orthogonal to the X-direction is taken as a "Y-direction;" and directions orthogonal to the X-direction and the Y-direction are called a "+Z direction" and a "−Z direction." The +Z direction is "up;" and the −Z direction is "down."

First Embodiment

A method for manufacturing a semiconductor device according to a first embodiment includes a connection method of connecting a first bonding point and a second bonding point by a wire using a capillary. In the first embodiment, a method for manufacturing a light-emitting device, which is one type of a semiconductor device, is described using a light-emitting element as a semiconductor element. In the description below, the first bonding point is positioned at the upper surface of a light-emitting element 13 placed on a first lead 11; and the second bonding point is positioned at the upper surface of a second lead 12.

Figure 2:
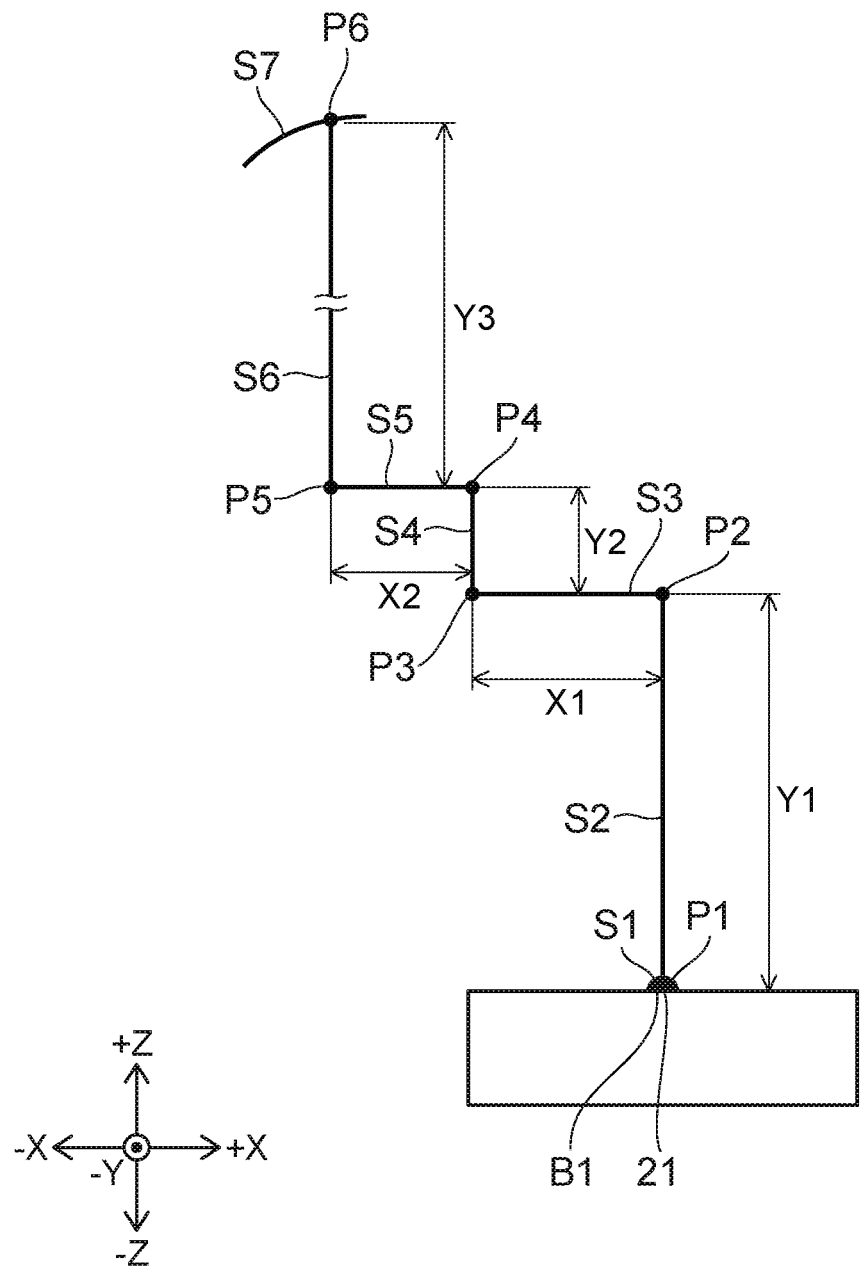
FIG. 2 is a partially enlarged view of FIG. 1.
Figure 4:
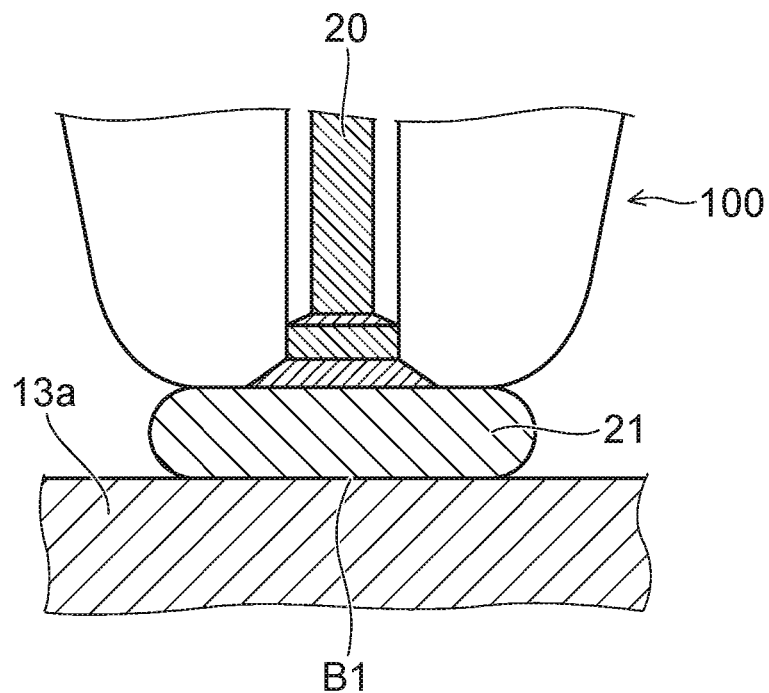
FIG. 4 is an end view showing the capillary and a first bonding point of the first embodiment.
Figure 5:
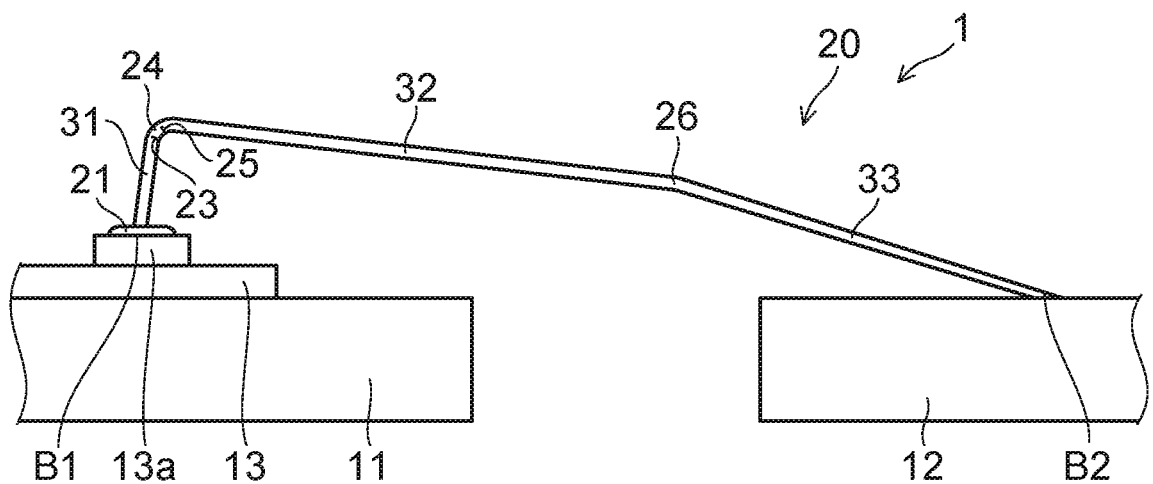
FIG. 5 is a side view showing a light-emitting device according to the first embodiment.

FIG. 1 is a drawing showing the path of the capillary of the wire connection method according to the first embodiment. FIG. 2 is a partially enlarged view of FIG. 1. FIGS. 3A to 3E are drawings showing the path of the capillary and the shape of the wire at each stage in the wire connection method according to the first embodiment. FIG. 4 is an end view showing the capillary and the first bonding point of the first embodiment. FIG. 5 is a side view showing the light-emitting device according to the first embodiment.

In FIGS. 3A to 3E, the path of the capillary is shown by a broken line; and the wire is shown by a solid line.

First Bonding Process

First, an initial ball is formed in the tip of a wire 20 by causing an electric discharge to the tip of the wire 20 in a state in which the capillary 100 holds the wire 20. An openable and closable clamp is provided in the upper portion of the capillary 100. The wire 20 that is inserted through the capillary 100 is clamped by the closing of the clamp and is in a dischargeable state by the opening of the clamp.

As shown in FIG. 4, the initial ball is brought into contact with a first bonding point B1 on an upper surface of an electrode 13a, is subsequently pressed by the capillary 100, and is applied with a load and an ultrasonic wave for a predetermined amount of time. Thereby, the initial ball deforms, and a ball portion 21 is formed. At this time, the position of the first bonding point B1 is taken as a position P1.

First Lifting Process

Figure 3:
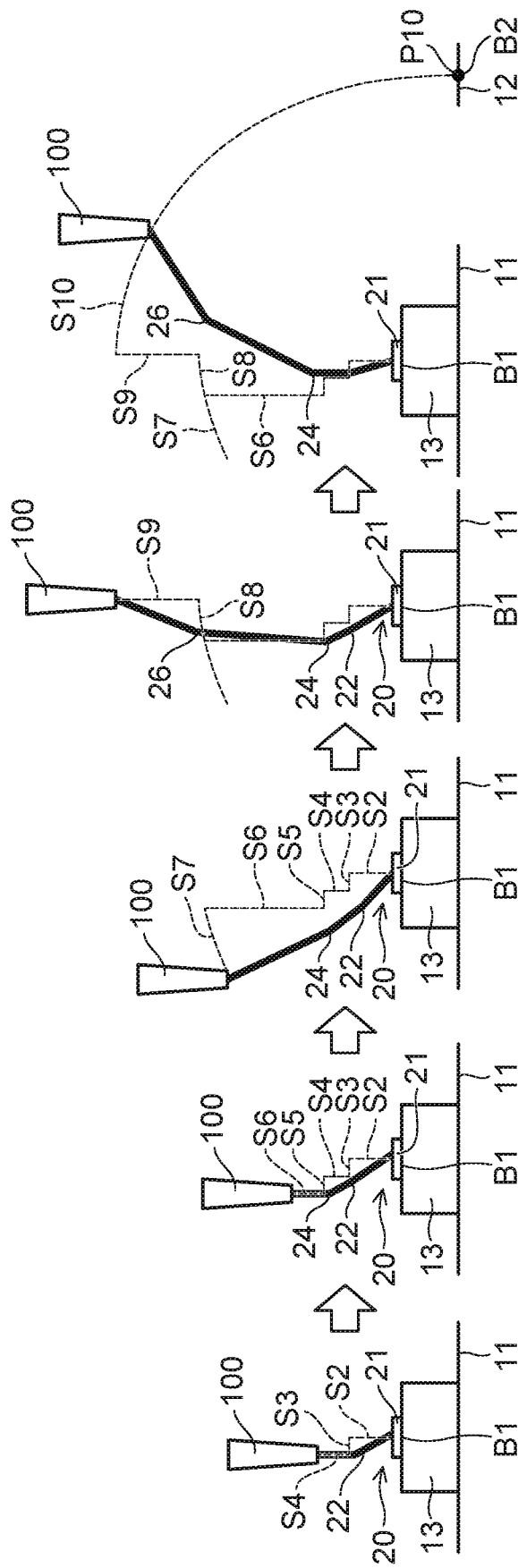
FIGS. 3A to 3E are drawings showing the path of the capillary and a shape of the wire at each stage in the wire connection method according to the first embodiment.

FIG. 3A illustrates the shape of the wire after the first lifting process and the first reverse process, and further after the second lifting process. After forming the ball portion 21 at the position P1, the capillary 100 opens the clamp and sets the wire 20 to a dischargeable state from the capillary 100. Then, the capillary 100 is moved upward (in the +Z direction) from the position P1 and caused to reach a position P2. Thereby, as shown in FIG. 3A, the wire 20 extends substantially directly upward from the ball portion 21 at the position P1 toward the position P2. At this time, the movement distance of the capillary 100, i.e., the distance between the position P1 and the position P2, is taken as a first vertical distance Y1. In the specification, the "position of the capillary 100" means the position of the tip portion of the capillary 100 where the wire 20 is discharged.

First Reverse Process

Then, the capillary 100 is moved in the −X direction (a first direction) from the position P2 and caused to reach a position P3. Thereby, as shown in FIG. 3A, the wire 20 extends in a substantially straight line shape in a state of being tilted from the position P1 toward the position P3. At this time, the movement distance of the capillary 100, i.e., the distance between the position P2 and the position P3, is taken as a first horizontal distance X1.

Second Lifting Process

FIG. 3B illustrates the shape of the wire partway through the third lifting process after the second lifting process and the second reverse process. The capillary 100 is moved upward from the position P3 and caused to reach the position P4. Thereby, the wire 20 extends from the position P1 to the position P4; but at the vicinity of the position P3 as shown in FIG. 33, the wire 20 bends so that the +X direction side is on the inside; and a first bent portion 22 is formed. A first bend mark 23 (referring to FIG. 5) is formed on the inner side of the first bent portion 22, i.e., the surface on the +X direction side of the wire 20. At this time, the movement distance of the capillary 100, i.e., the distance between the position P3 and the position P4, is taken as a second vertical distance Y2. The movement distance (the first vertical distance Y1) of the capillary 100 in the first lifting process is not less than the movement distance (the second vertical distance Y2) of the capillary 100 in the second lifting process. The second vertical distance Y2 is set to be the first vertical distance Y1 or less, and favorably less than the first vertical distance Y1. In other words, Y1≥Y2, and favorably Y1>Y2.

Second Reverse Process

Then, the capillary 100 is moved in the −X direction from the position P4 and caused to reach a position P5. Thereby, as shown in FIG. 3B, the wire 20 extends from the position P1 toward the position P5. At this time, although the first bent portion 22 is slightly elongated, the first bend mark 23 is maintained as-is. At this time, the movement distance of the capillary 100, i.e., the distance between the position P4 and the position P5, is taken as a second horizontal distance X2.

The movement distance (the first horizontal distance X1) of the capillary 100 in the first reverse process is not less than the movement distance (the second horizontal distance X2) of the capillary 100 in the second reverse process. The second horizontal distance X2 favorably is set to be the first horizontal distance X1 or less, and more favorably less than the first horizontal distance X1. In other words, favorably X1≥X2, and more favorably X1>X2. More favorably, the first vertical distance Y1 is set to be longer than the first horizontal distance X1; the first horizontal distance X1 is set to be longer than the second horizontal distance X2; and the second horizontal distance X2 is set to be longer than the second vertical distance Y2. In other words, Y1>X1>X2>Y2.

Third Lifting Process

FIG. 3C illustrates the shape of the wire after the third lifting process and the third reverse process. The capillary 100 is moved upward from the position P5 and caused to reach a position P6. Thereby, the wire 20 extends from the position P1 to the position P6; but at the vicinity of the position P5 as shown in FIG. 3C, the wire 20 bends so that the +X direction side is on the inside; and a second bent portion 24 is formed. A second bend mark 25 (referring to FIG. 5) is formed in the inner side of the second bent portion 24, i.e., the surface on the +X direction side of the wire 20. The second bend mark 25 is formed higher than the first bend mark 23. At this time, the movement distance of the capillary 100, i.e., the distance between the position P5 and the position P6, is taken as a third vertical distance Y3. The third vertical distance Y3 is set to be greater than the total value of the first vertical distance Y1 and the second vertical distance Y2. In other words, Y3>Y1+Y2. In FIG. 3C to FIG. 3E, the first bent portion 22 and the second bent portion 24 are illustrated as being separated for easier understanding; but actually, as shown in FIG. 5, the first bend mark 23 that is formed in the first bent portion 22 and the second bend mark 25 that is formed in the second bent portion 24 are positioned to be proximate one another. Also, the two bent portions 22, 24 are continuous and appear to have the configuration of one bent portion.

Third Reverse Process

Then, the capillary 100 is moved in a direction between the −X direction and down (the −Z direction) from the position P6 and is caused to reach a position P7. For example, the path of the capillary 100 is set to be a circular arc having the position P1 as a center. Thereby, the wire 20 extends from the position P1 toward the position P7. At this time, the first bent portion 22 and the second bent portion 24 are slightly elongated; but the first bend mark 23 and the second bend mark 25 are maintained as-is.

First Forward Process

FIG. 3D illustrates the shape of the wire after the first forward process and the fourth lifting process. The capillary 100 is caused to move on the reverse path of the capillary 100 of the third reverse process S7 past the start point (the position P6) of the third reverse process and is caused to reach a position P8 positioned on the second bonding point side, that is, in the +X direction (the second direction). For example, the position P8 is set to be directly above the position P1. Thereby, the wire 20 bends so that the +X direction side is on the inside; and a third bent portion 26 is formed. For example, the interior angle of the third bent portion 26 is an obtuse angle.

Fourth Lifting Process

Then, the capillary 100 is moved upward from the position P8 and caused to reach a position P9. Thereby, the wire 20 is held in a state in which the wire 20 is curved gradually to be convex toward the −X direction side between the position P1 and the position P9. At this time, the first bent portion 22 and the first bend mark 23 (referring to FIG. 5), the second bent portion 24 and the second bend mark 25 (referring to FIG. 5), and the third bent portion 26 are formed in the wire 20.

Second Forward Process

FIG. 3E illustrates the shape of the wire after the processes up to partway through the second forward process. Then, the capillary 100 is moved in a direction between the +X direction and down (the −Z direction) by drawing a circular arc from the position P9; and the capillary 100 is caused to reach a position P10 that is on the upper surface of the second lead 12. The position P10 is further in the +X direction and downward (in the −Z direction) than the position P1. Thereby, the second bent portion 24 is bent more deeply; and the interior angle of the second bent portion 24 is, for example, an acute angle. Also, the third bent portion 26 is bent more deeply; but the interior angle of the third bent portion 26 is still an obtuse angle. Thus, the wire 20 bends to be convex in a direction between the −X direction and up at the second bent portion 24 between the position P1 and the position P10; and at the third bent portion 26, the wire 20 is held in a state of being bent to be convex substantially upward. The forward process includes the first forward process S8, the fourth lifting process S9, and the second forward process S10.

Second Bonding Process

Then, the capillary 100 applies a load and an ultrasonic wave to the wire 20 in a state of pressing the wire 20 onto the upper surface of the second lead 12 at the second bonding point B2. Thereby, the wire 20 is bonded to the second bonding point B2 of the second lead 12 at the position P10. Then, after lifting the capillary 100, the wire 20 is fixed by closing the clamp; and the wire 20 is cut at the second bonding point B2 by lifting further in this state. As a result, the second lead 12 and the electrode 13a of the light-emitting element 13 are connected by the wire 20. Thus, the light-emitting device 1 according to the embodiment is manufactured.

In the light-emitting device 1 according to the embodiment as shown in FIG. 5, the first lead 11 and the second lead 12 are provided to be separated from each other. The light-emitting element 13 is mounted on the first lead 11. The electrode 13a is provided on the upper surface of the light-emitting element 13. The wire 20 is connected between the electrode 13a and the second lead 12. Specifically, one end of the wire 20 is bonded to the first bonding point B1 of the electrode 13a via the ball portion 21. The other end of the wire 20 is bonded to the second bonding point B2 on the upper surface of the second lead 12.

The wire 20 includes a first portion 31 that extends substantially upward from the ball portion 21, a second portion 32 that extends from the upper end of the first portion 31 in a direction including the +X direction, and a third portion 33 extending from the second portion 32 toward the second bonding point B2. The first portion 31, the second portion 32, and the third portion 33 are provided to be continuous in this order. The boundary between the first portion 31 and the second portion 32 is the second bent portion 24 that is bent to be convex in a direction between up (the +Z direction) and the −X direction. The boundary between the second portion 32 and the third portion 33 is the third bent portion 26 that is bent to be convex upward. The first bent portion 22 is not very noticeable because the first bent portion 22 is elongated in the second reverse process S5 and the third reverse process S7.

The angle between the direction in which the first portion 31 extends and the direction in which the second portion 32 extends, i.e., the interior angle of the second bent portion 24 is, for example, an acute angle; and the angle between the direction in which the second portion 32 extends and the direction in which the third portion 33 extends, i.e., the interior angle of the third bent portion 26, is an obtuse angle. Also, the two bend marks of the first bend mark 23 and the second bend mark 25 that extend in a direction crossing the direction in which the first portion 31 extends, e.g., the Y-direction, are formed in the side surface of the first portion 31 on the second bonding point B2 side.

Effects of the First Embodiment Will Now be Described

In the first embodiment, the first bent portion 22 and the first bend mark 23 are formed in the wire 20 in the first reverse process S3. Subsequently, in the second reverse process S5, the second bent portion 24 and the second bend mark 25 are formed above the first bent portion 22. As a result, when the capillary 100 is moved a large amount in the second forward process S10, the two points of the first bent portion 22 and the second bent portion 24 where the bending creases are provided by the two reverse operations are dispersed and become starting points of the bending by the second forward process S10; the wire 20 bends further; and the interior angle of the wire 20 becomes an acute angle.

At this time, because the first bent portion 22 exists directly under the second bent portion 24, the first bent portion 22 can support the second bent portion 24 when the second bent portion 24 is bent deeper in the second forward process S10. Therefore, the shape stability of the second bent portion 24 is good; and the shape of the wire 20 is good. Also, because the first bent portion 22 exists, the first portion 31 extends substantially vertically. Because the first portion 31 is a portion that supports the loop shape of the wire 20, the shape of the wire 20 is stable. Thus, according to the embodiment, the light-emitting device 1 can be obtained in which the shape of the wire 20 is stable. As a result, the wire 20 can be set to be fine while guaranteeing the loop shape; and the utilization efficiency of the light emitted from the light-emitting element 13 can be increased.

Also, by setting the first vertical distance Y1 to be the second vertical distance Y2 or more, the distance between the ball portion 21 and the first bent portion 22 can be set to the distance between the first bent portion 22 and the second bent portion 24 or more. Thereby, the first bent portion 22 can be disposed on the second bent portion 24 side of the ball portion 21; and the bend of the second bent portion 24 can be supported more effectively.

Further, by setting the first horizontal distance X1 to be the second horizontal distance X2 or more, the first bent portion 22 can be bent more strongly than the second bent portion 24 in the processes up to the third lifting process S6.

As a result, in the second forward process S10, the second bent portion 24 can be bent more reliably.

Second Embodiment

Figure 6:
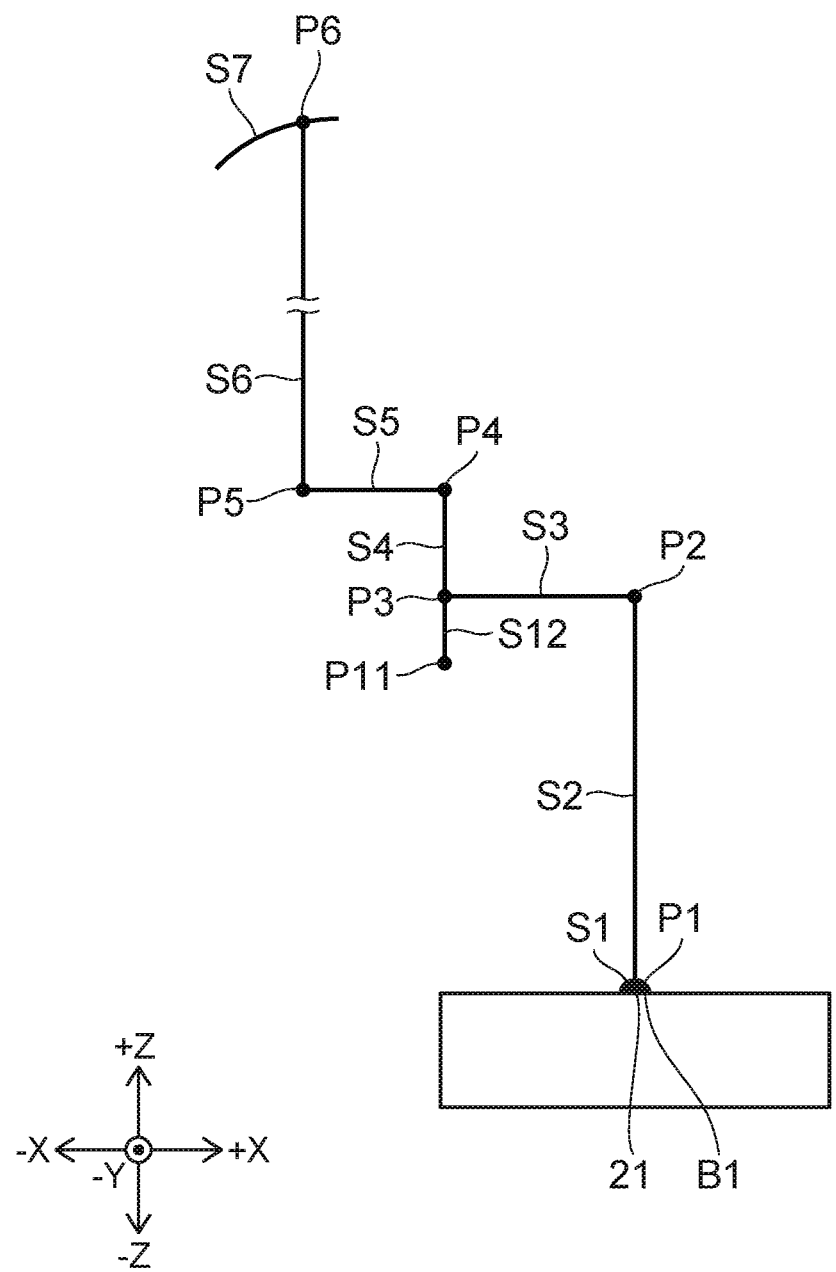
FIG. 6 is a drawing showing a path of a capillary of a wire connection method according to a second embodiment.

FIG. 6 is a drawing showing the path of the capillary of a wire connection method according to the second embodiment.

FIG. 6 corresponds to FIG. 2 of the first embodiment.

As shown in FIG. 6, a first lowering process S12 is provided between the first reverse process S3 and the second lifting process S4. In the first lowering process S12, the capillary 100 is moved downward (in the −Z direction) from the position P3 and is caused to reach a position P11. Subsequently, in the second lifting process S4, the capillary 100 is lifted from the position P11 to the position P4. Otherwise, the manufacturing method and the configuration of the light-emitting device of the second embodiment are similar to those of the first embodiment described above.

According to the second embodiment, the first bent portion 22 can be bent more deeply by inserting the first lowering process S12 between the first reverse process S3 and the second lifting process S4. As a result, in the subsequent processes, the first bent portion 22 can be bent more deeply. Otherwise, the effects of the second embodiment are similar to those of the first embodiment described above.

Third Embodiment

Figure 7:
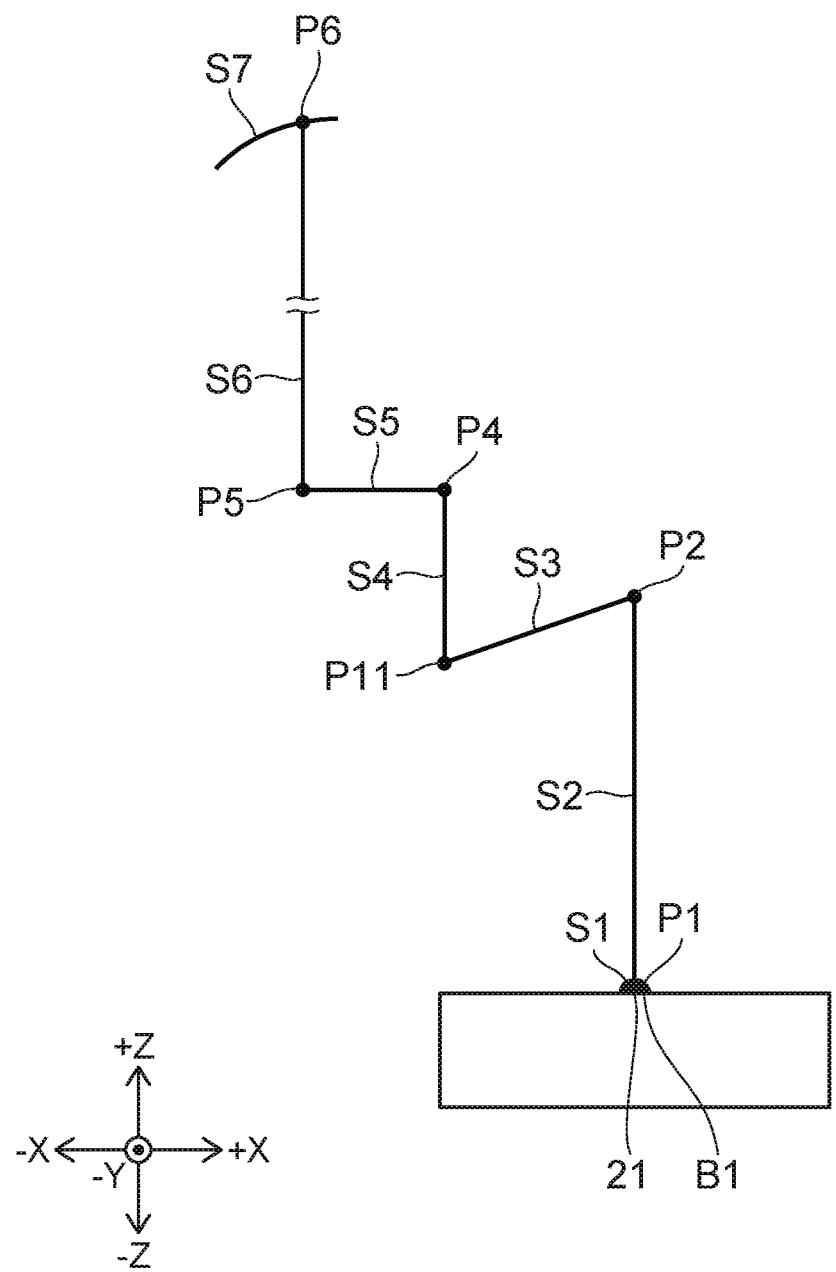
FIG. 7 is a drawing showing a path of a capillary of a wire connection method according to a third embodiment.

FIG. 7 is a drawing showing the path of the capillary of a wire connection method according to the third embodiment.

FIG. 7 corresponds to FIG. 2 of the first embodiment.

In the first reverse process S3 as shown in FIG. 7, the capillary 100 is moved linearly in a direction between the −X direction and down (the −Z direction), but rather than being caused to reach the position P3 (referring to FIG. 2), is instead caused to reach the position P11 that is lower than the position P3. Subsequently, in the second lifting process S4, the capillary 100 is lifted from the position P11 to the position P4. Otherwise, the manufacturing method and the configuration of the light-emitting device of the third embodiment are similar to those of the first embodiment described above.

According to the third embodiment, by moving the capillary 100 obliquely downward in the first reverse process S3, the first bent portion 22 can be bent more deeply. As a result, in the subsequent processes, the first bent portion 22 can be bent more deeply. Otherwise, the effects of the third embodiment are similar to those of the first embodiment described above.

Fourth Embodiment

Figure 8:
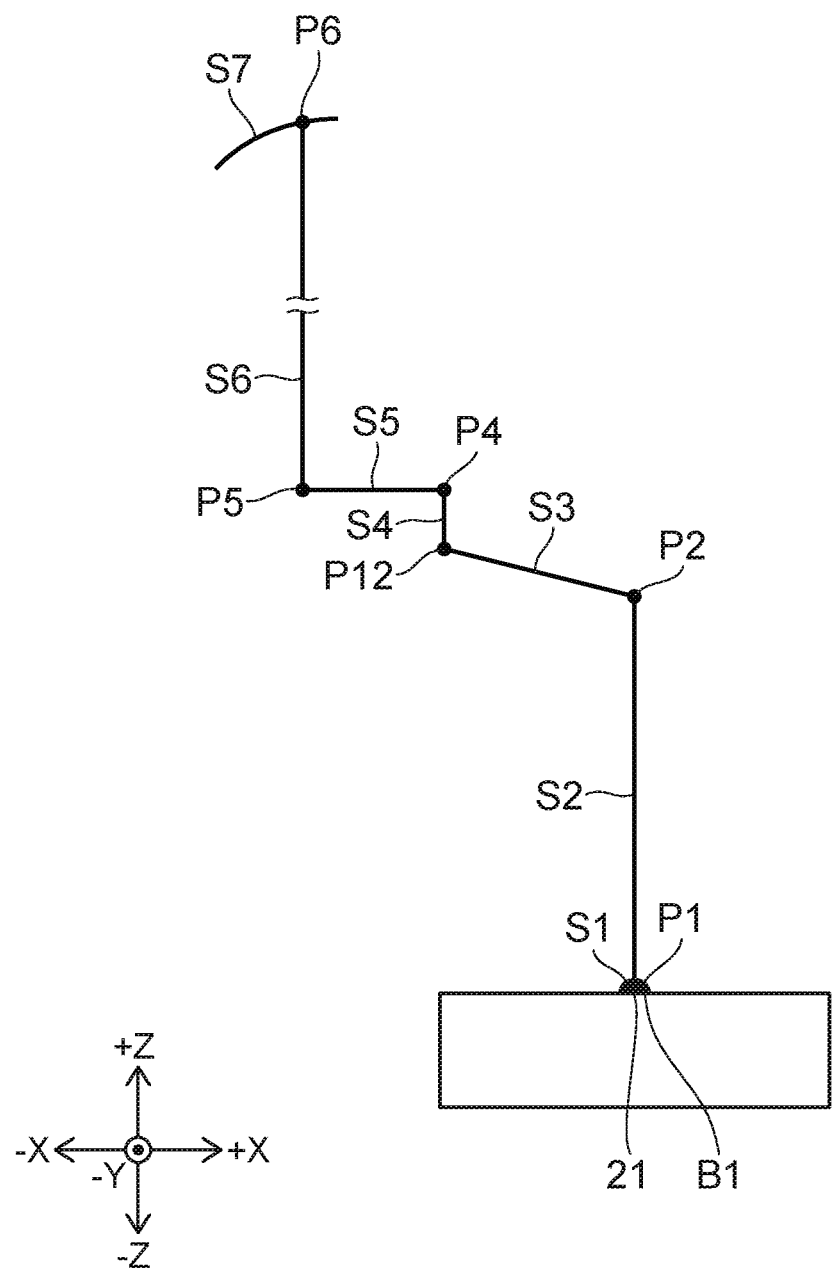
FIG. 8 is a drawing showing a path of a capillary of a wire connection method according to a fourth embodiment.

FIG. 8 is a drawing showing the path of the capillary of a wire connection method according to the fourth embodiment.

FIG. 8 corresponds to FIG. 2 of the first embodiment.

In the first reverse process S3 as shown in FIG. 8, the capillary 100 is moved linearly in a direction between the −X direction and up (the +Z direction), but rather than being caused to reach the position P3 (referring to FIG. 2), is instead caused to reach the position P12 that is higher than the position P3. Subsequently, in the second lifting process S4, the capillary 100 is lifted from the position P12 to the position P4. Otherwise, the manufacturing method and the configuration of the light-emitting device of the fourth embodiment are similar to those of the first embodiment described above.

According to the fourth embodiment, by moving the capillary 100 obliquely upward in the first reverse process S3, the load that is applied to the wire 20 can be reduced. There are cases where the reduction of the load of the wire 20 contributes to the shape stability of the wire 20 according to the design of the light-emitting device, the type of the wire 20, the conditions of the wire connection, etc. Otherwise, the effects of the fourth embodiment are similar to those of the first embodiment described above.

Fifth Embodiment

Figure 9:
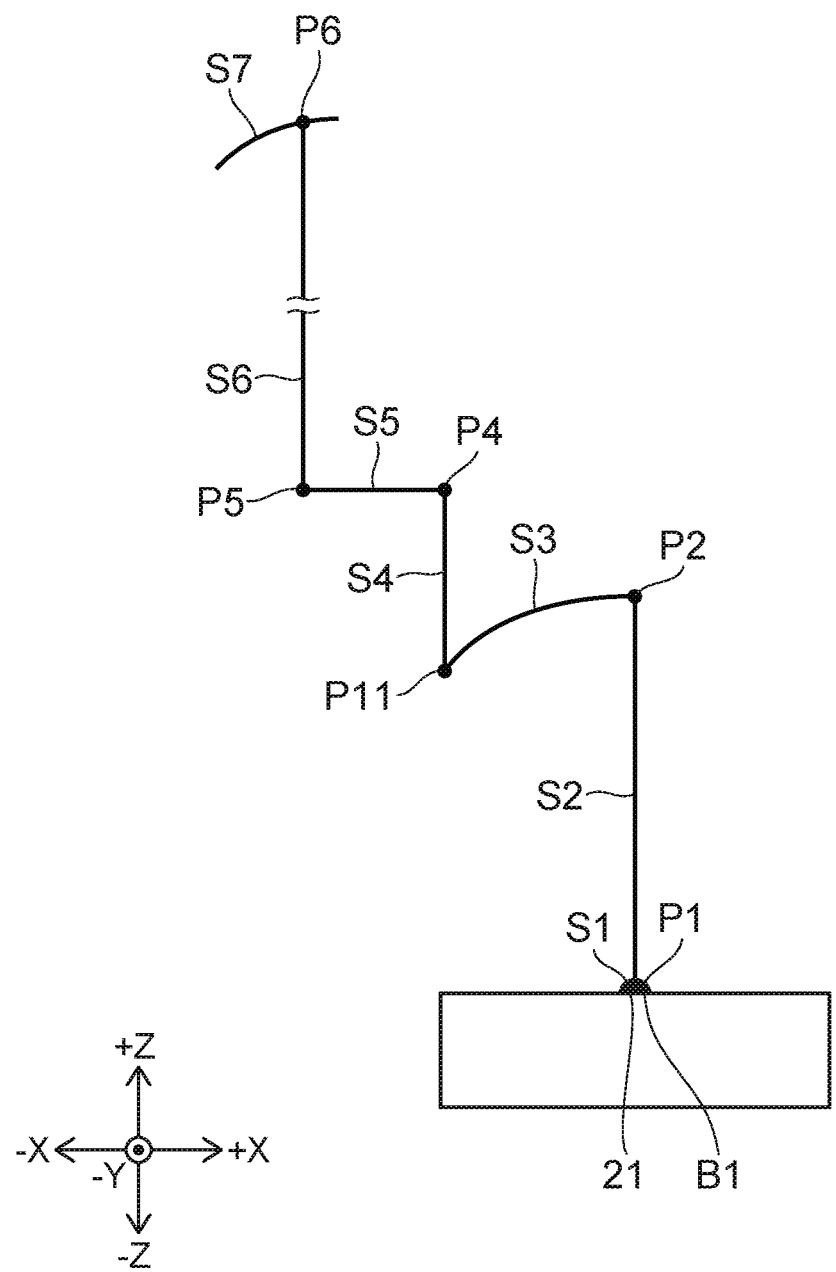
FIG. 9 is a drawing showing a path of a capillary of a wire connection method according to a fifth embodiment.

FIG. 9 is a drawing showing the path of the capillary of a wire connection method according to the fifth embodiment.

FIG. 9 corresponds to FIG. 2 of the first embodiment.

In the first reverse process S3 as shown in FIG. 9, the capillary 100 initially is moved in the −X direction; the movement direction is gradually changed downward; and the capillary 100 is moved curvilinearly to draw a circular arc. Then, the capillary 100 is not caused to reach the position P3 (referring to FIG. 2), but is instead caused to reach the position P11 that is lower than the position P3. In other words, in the first reverse process S3, the direction in which the capillary 100 moves as an entirety is a direction between the −X direction and the −Z direction. Subsequently, in the second lifting process S4, the capillary 100 is lifted from the position P11 to the position P4. Otherwise, the manufacturing method and the configuration of the light-emitting device of the fifth embodiment are similar to those of the first embodiment described above.

In the fifth embodiment, similarly to the third embodiment described above, the first bent portion 22 can be bent more deeply in the first reverse process S3. Otherwise, the effects of the fifth embodiment are similar to those of the first embodiment described above.

As shown in the third to fifth embodiments, in the first reverse process S3, the movement direction of the capillary 100 may not always be the −X direction (the first direction), and may be a direction including the −X direction. The "direction that includes the −X direction" is a direction of the synthesis of the −X direction and another direction, e.g., the +Z direction or the −Z direction, and includes the −X direction itself. In such a case, the first horizontal distance X1 refers to the distance parallel to the X-direction of the path of the capillary 100 in the first reverse process S3.

Sixth Embodiment

Figure 10:
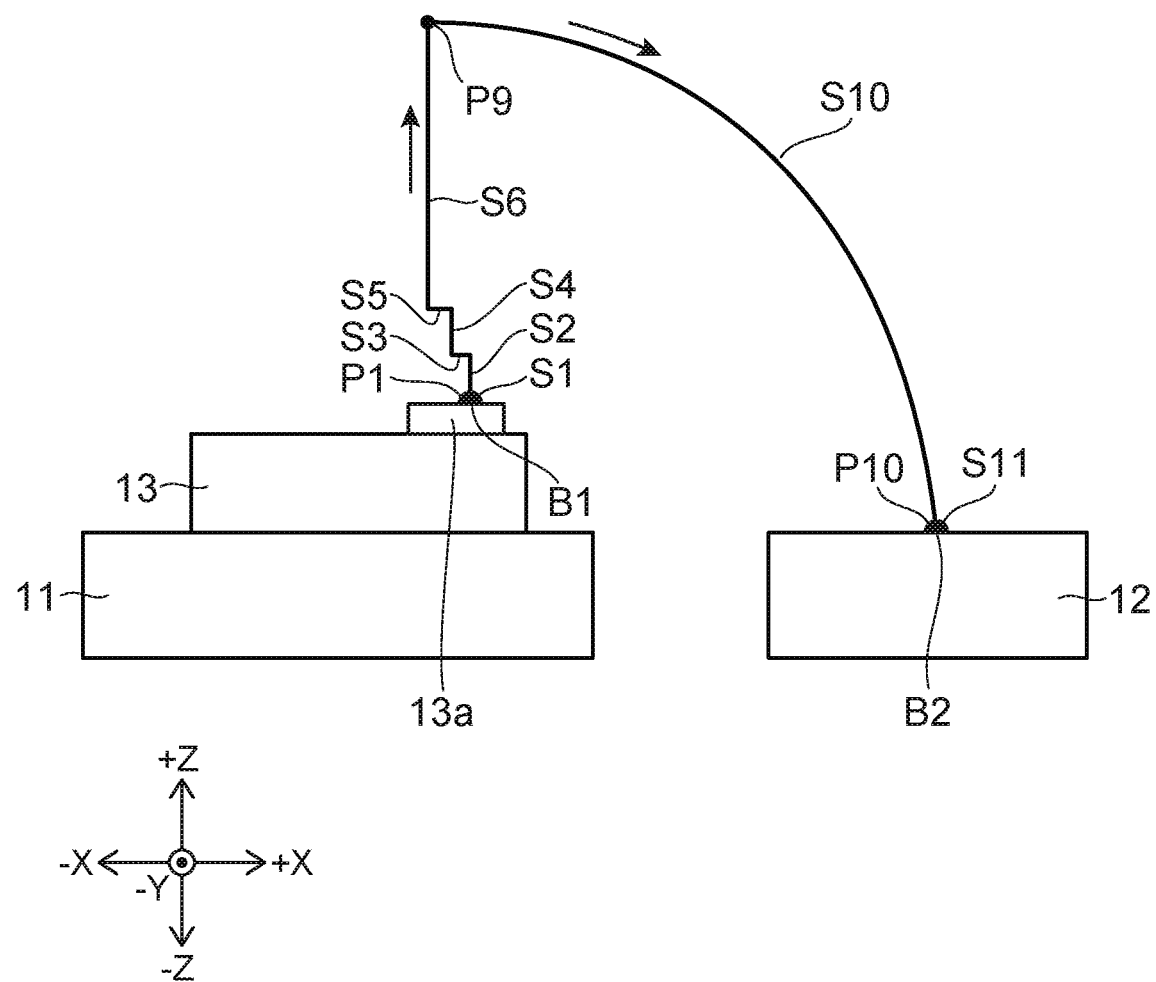
FIG. 10 is a drawing showing a path of a capillary of a wire connection method according to a sixth embodiment.

FIG. 10 is a drawing showing the path of the capillary of a wire connection method according to the sixth embodiment.

FIG. 10 corresponds to FIG. 1 of the first embodiment.

As shown in FIG. 10, the third reverse process S7, the first forward process S8, and the fourth lifting process S9 are omitted from the first embodiment. In other words, the capillary 100 is caused to reach the position P9 in the third lifting process S6; subsequently, the second forward process S10 is performed; and the capillary 100 is moved from the position P9 to the position P10. Otherwise, the manufacturing method, the configuration, and the effects of the light-emitting device of the sixth embodiment are similar to those of the first embodiment described above.

Seventh Embodiment

Figure 11:
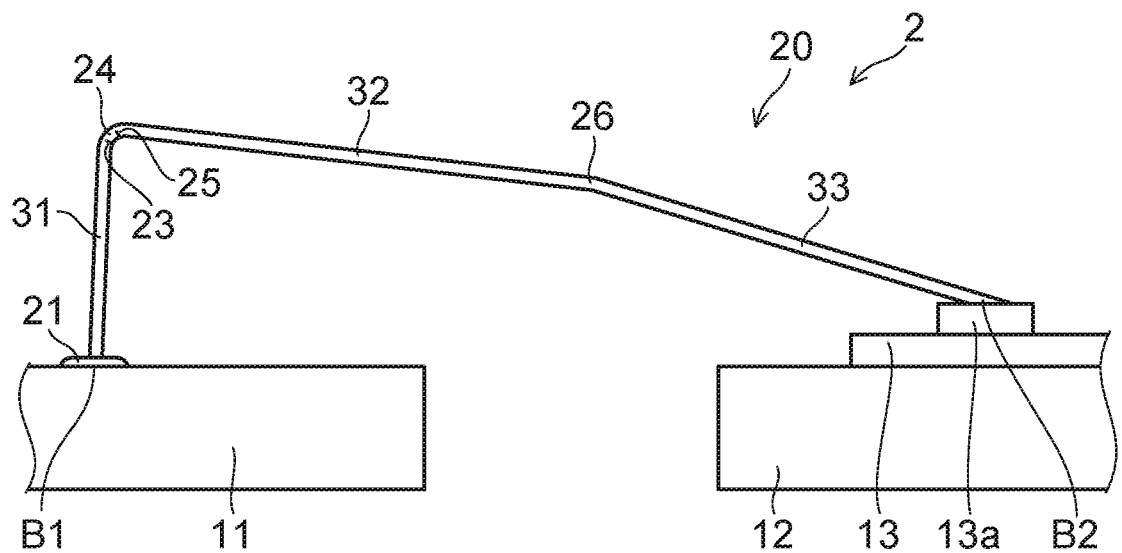
FIG. 11 is a side view showing a light-emitting device according to a seventh embodiment.

FIG. 11 is a side view showing a light-emitting device according to the seventh embodiment.

In the light-emitting device 2 as shown in FIG. 11, the light-emitting element 13 is mounted on the second lead 12. The first bonding point B1 is positioned on the upper surface of the first lead 11; and the second bonding point B2 is positioned on the upper surface of the electrode 13a provided on the upper surface of the light-emitting element 13.

In the first bonding process S1 in the seventh embodiment, the wire 20 is bonded to the first bonding point B1 of the first lead 11. Then, the first lifting process S2, the first reverse process S3, the second lifting process S4, the second reverse process S5, the third lifting process S6, the third reverse process S7, the first forward process S8, the fourth lifting process S9, and the second forward process S10 are performed by a method similar to that of the first embodiment described above. Then, in the second bonding process S11, the wire 20 is bonded to the second bonding point B2 of the electrode 13a of the light-emitting element 13.

Otherwise, the manufacturing method, the configuration, and the effects of the light-emitting device of the seventh embodiment are similar to those of the first embodiment described above.

The seventh embodiment may be combined with one of the second to sixth embodiments described above.

Eighth Embodiment

An eighth embodiment will now be described.

Figure 12:
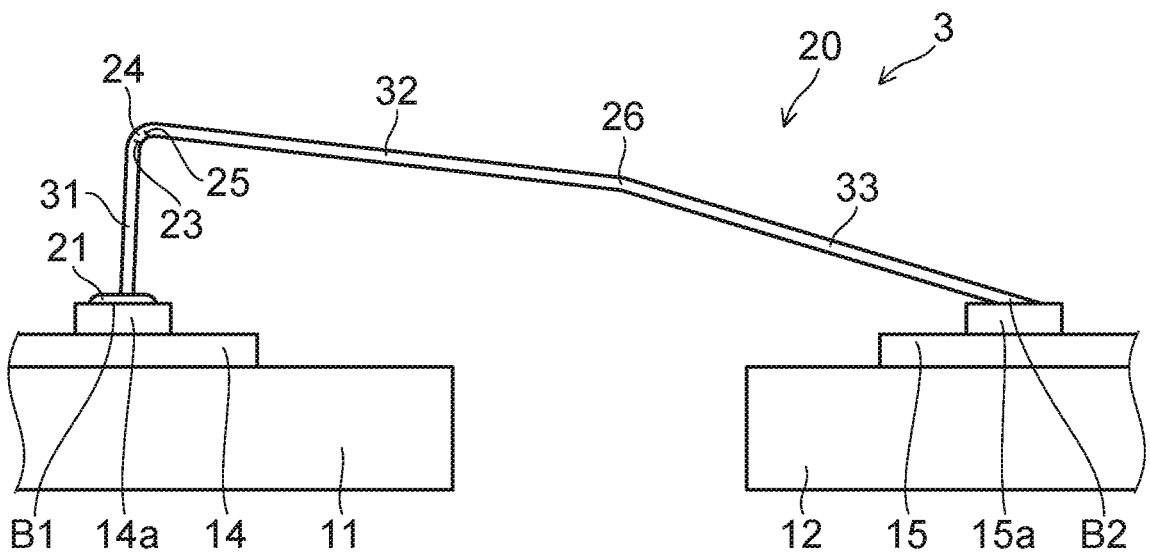
FIG. 12 is a side view showing a light-emitting device according to an eighth embodiment.

FIG. 12 is a side view showing a light-emitting device according to the eighth embodiment.

In the light-emitting device 3 according to the eighth embodiment as shown in FIG. 12, a first light-emitting element 14 is mounted on the first lead 11; and a second light-emitting element 15 is mounted on the second lead 12. An electrode 14a is provided on the upper surface of the first light-emitting element 14; and an electrode 15a is provided on the upper surface of the second light-emitting element 15. The first bonding point B1 is positioned on the upper surface of the electrode 14a; and the second bonding point B2 is positioned on the upper surface of the electrode 15a. The wire 20 is connected between the first bonding point B1 of the electrode 14a formed on the upper surface of the first light-emitting element 14 and the second bonding point B2 of the electrode 15a formed on the upper surface of the second light-emitting element 15.

In the embodiment, the wire 20 is bonded to the first bonding point B1 of the electrode 14a of the first light-emitting element 14 in the first bonding process S1. Then, the first lifting process S2 to the second forward process S10 are performed by a method similar to that of the first embodiment described above. Then, the wire 20 is bonded to the second bonding point B2 of the electrode 15a of the second light-emitting element 15 in the second bonding process S11.

Otherwise, the manufacturing method, the configuration, and the effects of the light-emitting device of the eighth embodiment are similar to those of the first embodiment described above.

The eighth embodiment may be combined with one of the second to sixth embodiments described above. Gold, silver, aluminum, etc., are examples of the material of the wire 20. In the case of a light-emitting device, it is favorable for the wire 20 to have a high reflectance to the light from the light-emitting element; and it is favorable for the wire 20 to include, for example, gold, silver, or an alloy of gold and/or silver.

TEST EXAMPLE

A test example will now be described.

In the test example, a wire connection was performed and a sample was made using the method described in the first embodiment. As the wire 20, gold was used as the major component; and a wire having a diameter of 18 µm was used. In this case, the first horizontal distance X1, the second horizontal distance X2, the first vertical distance Y1, and the second vertical distance Y2 were set to be different from each other. For one set of conditions, multiple samples were made; and the stability of the shape of the wire 20 was evaluated by the naked eye.

The evaluation results of the distances and the stability of the wire shape are shown in Table 1. The units of the distances shown in Table 1 are "µm." Four levels "A," "B," "C," and "D" were used as the evaluation of the "wire shape." "A" is the best, continuing with "B" and "C," and "D" is the lowest evaluation. Even for the connection conditions for which the evaluation of the test is "D," a product that has no problems as an actual product is manufacturable if the diameter of the wire, etc., are selected appropriately.

TABLE 1

| No. | Y1  | X1 | Y2 | X2 | wire shape |
|-----|-----|----|----|----|------------|
| 1   | 86  | 34 | 10 | 30 | A          |
| 2   | 80  | 80 | 1  | 1  | B          |
| 3   | 60  | 60 | 21 | 21 | B          |
| 4   | 114 | 9  | 1  | 1  | B          |
| 5   | 114 | 1  | 9  | 1  | B          |
| 6   | 80  | 1  | 80 | 1  | B          |
| 7   | 60  | 9  | 55 | 1  | B          |
| 8   | 60  | 1  | 21 | 80 | C          |
| 9   | 60  | 1  | 55 | 9  | C          |
| 10  | 96  | 64 | 0  | 0  | D          |

For the sample No. 1, the wire shape was the best among these samples because Y1>Y2, X1>X2, and Y1>X1>X2>Y2. For the samples No. 2 to No. 7, the wire shape was quite good because Y1≥Y2 and X1≥X2. For the sample No. 8 and No. 9, the wire shape was good because Y1>Y2. Conversely, for the sample No. 10, the second lifting process S4 and the second reverse process S5 are not performed. Therefore, the bent portion that corresponds to the first bent portion 22 is not formed; and the wire shape degraded compared to the other samples.

The embodiments described above are examples embodying the invention; and the invention is not limited to these embodiments. For example, the embodiments described above that have additions, deletions, or modifications for some of the components or processes also are included in the scope of the invention. The embodiments described above can be carried out in combination with each other.

For example, the invention can be utilized in a lighting device, a light source of a display device, etc.

What is claimed is:

1. A method for manufacturing a semiconductor device, the method comprising:
   a first bonding process comprising bonding, at a first bonding point, a tip of a wire held by a capillary;
   a first lifting process comprising moving the capillary upward;

a first reverse process comprising moving the capillary in a direction that includes a component in a first direction, the first direction being from a second bonding point toward the first bonding point;

a second lifting process comprising moving the capillary upward, wherein a first bent portion is formed between a first part of the wire discharged from the capillary in the first lifting process and a second part of the wire discharged from the capillary in the second lifting process;

a second reverse process comprising moving the capillary in the first direction;

a third lifting process comprising moving the capillary upward, wherein a second bent portion is formed between the second part of the wire and a third part of the wire discharged from the capillary in the third lifting process;

a forward process comprising moving the capillary toward the second bonding point; and a second bonding process comprising bonding the wire at the second bonding point, wherein a movement distance of the capillary in the first lifting process is not less than a movement distance of the capillary in the second lifting process.

2. The method according to claim 1, wherein:

the movement distance of the capillary in the first lifting process is greater than a movement distance of the capillary in the first reverse process, the movement distance of the capillary in the first reverse process is greater than a movement distance of the capillary in the second reverse process, and the movement distance of the capillary in the second reverse process is greater than the movement distance of the capillary in the second lifting process.

3. The method according to claim 1, wherein, in the first reverse process, the capillary is moved in the first direction.

4. The method according to claim 1, further comprising a first lowering process comprising, between the first reverse process and the second lifting process, moving the capillary downward.

5. The method according to claim 1, wherein, in the first reverse process, the capillary is moved in a direction between the first direction and downward.

6. The method according to claim 1, wherein, in the first reverse process, the capillary is moved in a direction between the first direction and upward.

7. The method according to claim 1, further comprising a third reverse process comprising, after the third lifting process and before the forward process, moving the capillary in a direction between the first direction and downward.

8. The method according to claim 7, wherein:

the forward process comprises:

a first forward process comprising moving the capillary on a reverse path of the capillary of the third reverse process and further moving the capillary past a start point of the third reverse process toward the second bonding point side;

a fourth lifting process comprising moving the capillary upward; and a second forward process comprising moving the capillary in a direction between a second direction and downward, the second direction being from the first bonding point toward the second bonding point.

9. A method for manufacturing a semiconductor device, the method comprising:

a first bonding process comprising bonding, at a first bonding point, a tip of a wire held by a capillary;

a first lifting process comprising moving the capillary upward;

a first reverse process comprising moving the capillary in a direction that includes a component in a first direction, the first direction being from a second bonding point toward the first bonding point;

a second lifting process comprising moving the capillary upward;

a second reverse process of moving the capillary in the first direction;

a third lifting process comprising moving the capillary upward;

a third reverse process comprising moving the capillary in a direction between the first direction and downward;

a forward process comprising moving the capillary toward the second bonding point; and a second bonding process comprising bonding the wire at the second bonding point, wherein a movement distance of the capillary in the first reverse process is not less than a movement distance of the capillary in the second reverse process.

10. A method for manufacturing a semiconductor device, the method comprising:

a first bonding process comprising bonding, at a first bonding point, a tip of a wire held by a capillary;

a first lifting process comprising moving the capillary upward;

a first reverse process comprising moving the capillary in a direction that includes a component in a first direction, the first direction being from a second bonding point toward the first bonding point;

a second lifting process comprising moving the capillary upward;

a second reverse process comprising moving the capillary in the first direction;

a third lifting process comprising moving the capillary upward;

a third reverse process comprising moving the capillary in a direction between the first direction and downward;

a forward process comprising moving the capillary toward the second bonding point; and a second bonding process comprising bonding the wire at the second bonding point, wherein a movement distance of the capillary in the first lifting process is not less than a movement distance of the capillary in the second lifting process.

11. A method for manufacturing a semiconductor device, the method comprising:

a first bonding process comprising bonding, at a first bonding point, a tip of a wire held by a capillary;

a first lifting process comprising moving the capillary upward;

a first reverse process comprising moving the capillary in a direction that includes a component in a first direction, the first direction being from a second bonding point toward the first bonding point;

a second lifting process comprising moving the capillary upward;

a second reverse process comprising moving the capillary in the first direction;

a third lifting process comprising moving the capillary upward;

a forward process comprising moving the capillary toward the second bonding point; and a second bonding process comprising bonding the wire at the second bonding point, wherein a movement distance of the capillary in the first lifting process is not less than a movement distance of the capillary in the second lifting process, wherein:

the movement distance of the capillary in the first lifting process is greater than a movement distance of the capillary in the first reverse process, the movement distance of the capillary in the first reverse process is greater than a movement distance of the capillary in the second reverse process, and the movement distance of the capillary in the second reverse process is greater than the movement distance of the capillary in the second lifting process.

* * * * *